US010482204B2

(12) United States Patent
Marie et al.

(10) Patent No.: US 10,482,204 B2
(45) Date of Patent: Nov. 19, 2019

(54) SYSTEM FOR PROCESSING DATA AND MODELLING FOR ANALYSIS OF THE ENERGY CONSUMPTION OF A SITE

(71) Applicant: Schneider Electric Industries SAS, Rueil Malmaison (FR)

(72) Inventors: Sylvain Marie, Grenoble (FR); Frederic Suard, Versailles (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 439 days.

(21) Appl. No.: 15/044,516

(22) Filed: Feb. 16, 2016

(65) Prior Publication Data
US 2016/0371412 A1 Dec. 22, 2016

(30) Foreign Application Priority Data
Feb. 17, 2015 (FR) .................................. 15 51302

(51) Int. Cl.
*G06F 17/50* (2006.01)
*G01D 4/00* (2006.01)
(Continued)

(52) U.S. Cl.
CPC ......... *G06F 17/5031* (2013.01); *G01D 4/002* (2013.01); *G06F 3/0482* (2013.01);
(Continued)

(58) Field of Classification Search
CPC ............ H04N 21/4344; G01R 19/2513; G05B 23/0272; G05B 15/02; G01H 1/00; G06Q 30/02; G06F 9/4418
See application file for complete search history.

(56) References Cited

U.S. PATENT DOCUMENTS 7,146,288 B1 * 12/2006 Welch ................ H04N 21/4344
                                                        702/179
8,239,178 B2    8/2012 Gray et al.
(Continued)

FOREIGN PATENT DOCUMENTS

EP            1 309 062 A2     5/2003

OTHER PUBLICATIONS

French Preliminary Search Report dated Jan. 22, 2016 in French Application 15 51302, filed Feb. 17, 2015 (with English Translation of Categories of Cited Documents).
(Continued)

*Primary Examiner* — Kandasamy Thangavelu
(74) *Attorney, Agent, or Firm* — Oblon, McClelland, Maier & Neustadt, L.L.P.

(57) ABSTRACT

Data processing method for analysis of the energy consumption of a site on the basis of measurements including:
  selection of data time series,
  segmentation of the time series into segments,
  projection of the segments,
  display of the projections of the data segments,
  e) selection of at least one first group of data segments,
  establishment of a digital model of classification characterising the first group of data segments, selected on the basis of calendar metadata
  establishment of a digital model of classification characterising the first group of data segments, selected on the basis of the segments' profiles (FIG. 5B).

14 Claims, 12 Drawing Sheets

(51) Int. Cl.
*G06F 17/18* (2006.01)
*G06K 9/62* (2006.01)
*G06F 3/0482* (2013.01)
*G06K 9/00* (2006.01)

(52) U.S. Cl.
CPC ......... *G06F 17/18* (2013.01); *G06K 9/00496* (2013.01); *G06K 9/6218* (2013.01); *G06K 9/6253* (2013.01)

(56) References Cited

U.S. PATENT DOCUMENTS

| | | | | |
|---|---|---|---|---|
| 2008/0177994 | A1* | 7/2008 | Mayer | G06F 9/4418 713/2 |
| 2010/0286937 | A1* | 11/2010 | Hedley | G06Q 30/02 702/60 |
| 2011/0047418 | A1* | 2/2011 | Drees | G05B 15/02 714/57 |
| 2012/0197560 | A1* | 8/2012 | Kuhns | G01R 19/2513 702/60 |
| 2013/0151179 | A1 | 6/2013 | Gray | |
| 2013/0151212 | A1* | 6/2013 | Gray | G06Q 50/06 703/2 |
| 2014/0266673 | A1* | 9/2014 | Mello | G05B 23/0272 340/506 |
| 2015/0276508 | A1* | 10/2015 | Smullin | G01H 1/00 702/130 |

OTHER PUBLICATIONS

Hala Najmeddine et al. "Mesures de Similarite Pour L'Aide a L'Analyse des Donnees Energetiques de Batiments", Version 1, RFIA 2012 (Reconnaissance de Formes et Intelligence Artificielle), Jan. 24-27, 2012, 8 pages.
Cedric Gouy-Pailler et al. "Distance and Similarity Measures for Sensors Selection in Heavily Instrumented Buildings: Application to the Incas Platform", Proceedings of the CIB W78-W102 2011: International Conference, Oct. 26-28, 2011, 10 pages.
Matthew Brown et al. "Kernel Regression for Real-Time Building Energy Analysis", Journal of Building Performance Simulation, vol. 5, No. 4, 2012, 18 pages.
Nobuyuki Yamaguchi et al. "Regression Models for Demand Reduction Based on Cluster Analysis of Load Profiles", 2009 IEEE PES/IAS Conference on Sustainable Alternative Energy (SAE), 2009, 7 pages.
Gianfranco Chicco et al. "Comparisons Among Clustering Techniques for Electricity Customer Classification", IEEE Transactions on Power Systems, vol. 21, No. 2, May 2006, 8 pages.
Richard J. Povinelli et al. "A New Temporal Pattern Identification Method for Characterization and Prediction of Complex Time Series Events", IEEE Transactions on Knowledge and Data Engineering, vol. 15, No. 2, 2003, 14 pages.
Amir B. Geva "Hierarchical-Fuzzy Clustering of Temporal-Patterns and its Application for Time-Series Prediction", Pattern Recognition Letters, vol. 20, 1999, 14 pages.
Jin Qi et al. "Electrical Evoked Potentials Prediction Model in Visual Prostheses Based on Support Vector Regression with Multiple Weights", Applied Soft Computing, vol. 11, 2011, 13 pages.
Antti Sorjamaa et al. "Methodology for Long-Term Prediction of Time Series", Neurocomputing, vol. 70, 2007, 9 pages.
F. Martinez-Alvarez et al. "Discovery of Motifs to Forecast Outlier Occurrence in Time Series", Pattern Recognition Letters, vol. 32, 2011, 14 pages.
Jimeng Sun et al. "Two Heads Better Than One: Pattern Discovery in Time-Evolving Multi-Aspect Data", Data Min Knowl Disc, vol. 17, Jul. 10, 2008, 18 pages.
Jimeng Sun et al. "Window-Based Tensor Analysis on High-Dimensional and Multi-Aspect Streams", ICDM, vol. 6, 2006, 5 pages.
Francisco Martinez-Alvarez et al. "Energy Time Series Forecasting Based on Pattern Sequence Similarity", IEEE Transactions on Knowledge and Data Engineering, vol. 23, No. 8, 2011, 14 pages.

* cited by examiner

| Created groups | Management of groups |
|---|---|
|  | Closed |
|  | Start-up days |
|  | Working days |
|  | Closure days |

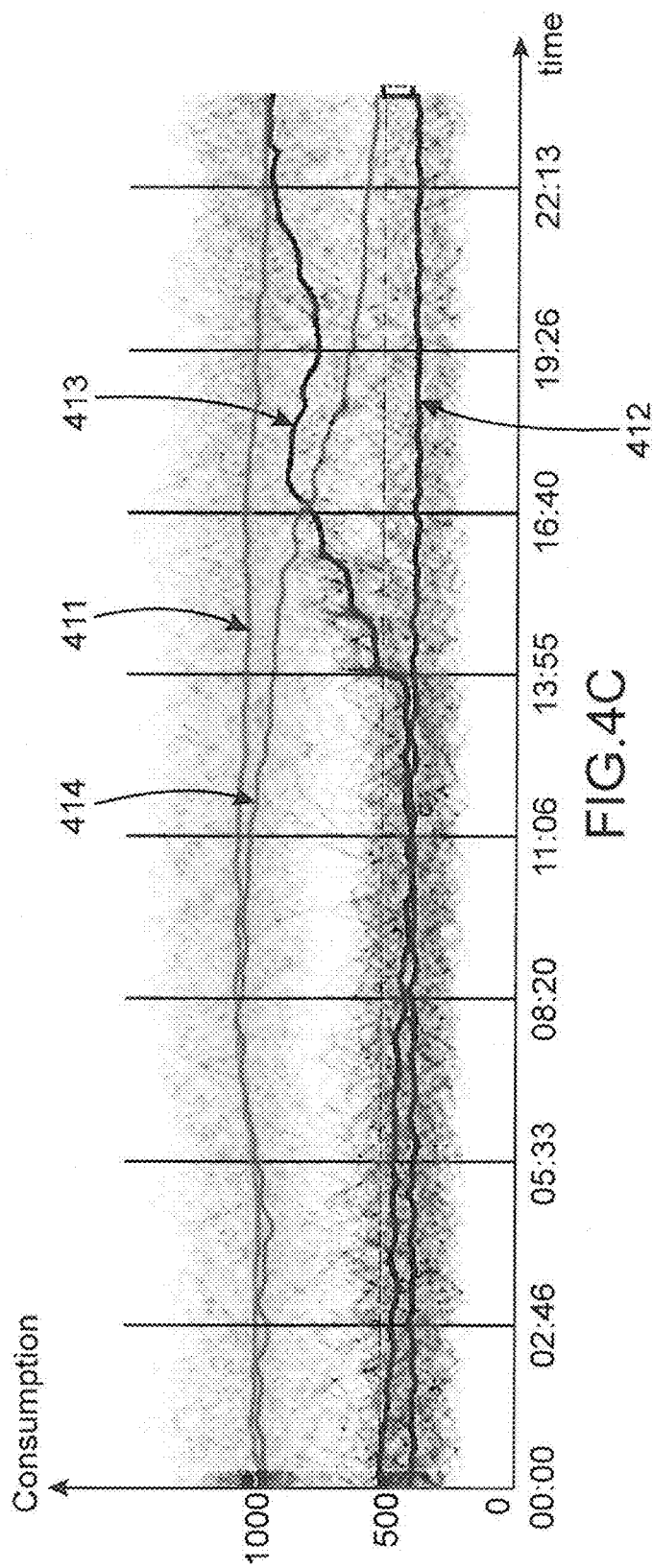

| |
|---|
| 2014-01-01 |
| 2014-01-02 |
| 2014-01-03 |
| 2014-01-04 |
| 2014-01-05 |
| 2014-01-06 |
| 2014-01-07 |
| 2014-01-08 |
| 2014-01-09 |
| 2014-01-10 |
| 2014-01-11 |
| 2014-01-12 |
| 2014-01-13 |
| 2014-01-14 |
| 2014-01-15 |
| 2014-01-16 |
| 2014-01-17 |
| 2014-01-18 |
| 2014-01-19 |
| 2014-01-20 |
| 2014-01-21 |
| 2014-01-22 |
| 2014-01-23 |
| 2014-01-24 |
| 2014-01-25 |
| 2014-01-26 |
| 2014-01-27 |
| 2014-01-28 |
| 2014-01-29 |
| 2014-01-30 |
| 2014-01-31 |
| 2014-02-01 |
| 2014-02-02 |
| 2014-02-03 |
| 2014-02-04 |
| 2014-02-05 |
| 2014-02-06 |
| 2014-02-07 |
| 2014-02-08 |
| 2014-02-09 |
| 2014-02-10 |
| 2014-02-11 |

FIG.4H

SYSTEM FOR PROCESSING DATA AND MODELLING FOR ANALYSIS OF THE ENERGY CONSUMPTION OF A SITE

DISCLOSURE

Technical Field and Prior Art

The present invention relates to the field of computer processing of measurement data and of modelling of this data to allow analysis of the energy consumption of sites such as residential buildings, commercial premises, factories and data centres.

To conduct an energy consumption audit of a site, in addition to the measurement readings of electrical meters, platforms have appeared fitted with sensors which measure many parameters at different positions in the site, including temperature, humidity and differential pressure, with high sampling rates. In addition, the platforms used in systems for planning, control and supervision of industrial processes are also online, providing many parameters, including hours worked and quantities produced.

This assembly may produce enormous quantities of data for analysis, for example, by energy experts.

There is a need for a new computer tool allowing rapid understanding of how a site operates in terms of energy consumption, making it possible to analyse its performance over a given period, and in particular to check whether this site has followed an expected operating mode, and to model the operation of this site for future monitoring of its performance.

DESCRIPTION OF THE INVENTION

One embodiment of the present invention provides a method for processing data for the analysis of the energy consumption of at least one site using measurement data, including electrical consumption measurement data and also data for measuring one or more physical parameters, taken from at least one measuring device installed in this site, where the process includes steps consisting in, by means of a computer processing system:

a) selecting, within a chosen analysis time range, time series of data taken from the measuring device, where the time series are associated with metadata which explains the said data time series, b) segmenting the data time series into multiple data segments of identical duration, c) projecting the selected data segments located within this analysis time range in a space having at least two dimensions, according to their degree of similarity, d) displaying in a software graphical interface by means of a display device connected to the computer processing system, a graphical representation of the said space including projections of the data segments, where some projections are grouped together in the form of one or more groups of data segments.

The measuring device has one or more measuring element(s), including at least one electrical consumption meter and/or one or more sensors for measuring physical magnitude(s).

The creation of groups of segments can be established automatically by means of a non-supervised classification algorithm, for example by partitioning, with methods of the k-means type, partitioning around medoids (PAM, k-medoids), CLARA (acronym of "Clustering LARge Application"), dynamic clouds method, fuzzy classification method (FANNY), or DBSCAN (acronym of "Density-Based Spatial Clustering of Applications with Noise"); or, for example, by hierarchical classification, with methods of the ascending hierarchical classification type (AGNES, acronym of "agglomerative nesting"), or descending classification hierarchical type (DIANA, acronym of "divisive analyzing").

A graphical representation of this kind facilitates the selection of data and the discrimination of aberrant data.

The processing can then include steps consisting in:

e) selecting at least one first group of data segments, f) establishing one or more digital models characterising the first selected group of data segments.

In a subsequent step, after new data is acquired, such models can allow the site's performance to be monitored, and any consumption anomalies in a site to be detected.

The models established in step f) can include an individual digital model characterising whether the data segments qualifies for the first group, where this model is constructed from an analysis of measurement time profiles contained in the data segments of this first group. This model can be linear, piecewise linear or non-linear and, for example, be based on detection thresholds, a one-class support vector machine, or kernel principal component analysis.

The models established in step f) can also include a calendar individual digital model giving a condition showing whether new data qualifies for a data group, on the basis of time metadata associated with the said new data.

After step f) steps can be accomplished consisting in:
acquisition of new data,
using the characteristic individual digital model to check whether new data qualifies for a data group.

The models established in step f) can include a regression model, which can provide an estimate of the measurement data of at least one selected element of the measuring device, on the basis of data taken from one or more other measuring element(s) of the measuring device.

For example, this model can be linear, piecewise linear or non-linear, based on a "least-squares" method or a support vector machine, or a relevance vector machine.

According to one possible embodiment, the method may include steps consisting in:
establishing for the first group a standard profile of magnitude(s) measured by the measuring device for a duration equal to that of the segments, and subsequently
displaying this standard profile using the graphical interface.

The method may include steps consisting in:
selecting, using the software graphical interface, a specific group of data segments,
associating this individual group with an identifier.

The identifier can be produced using a naming algorithm implementing a decision tree and using metadata associated with the data segments of the individual group.

The selection of the data time series in step a) may include a selection of at least one type of metadata, in particular:
of a site zone descriptor to select time series of measurement data taken from one or more specific zones of the site from among a set of zones in the site,
and/or a descriptor of the measuring device type to select time series of data taken from one or more types of specific measuring means from a set of measuring means of the measuring device,
and/or a descriptor of the site measuring parameter type to select time series of data relating to one or more types of physical parameters from among a set of physical parameters which the measuring device is able to measure.

According to one possible embodiment, the method may also consist of a selection, using the software graphical interface, from among the said projections of segments, of one or more specific projections which do not qualify for any group.

The graphical representation obtained in step d) may be shown in a first window of the software graphical interface, in which the segments are also represented in another form in a second window of the graphical interface, where the selection of the first group in the said first window leads to selection and highlighting in the said second window of the segments of the first group.

The selection of the data time series made in step a), or the selection of the first group made in step e), can be accomplished by means of this other graphical representation.

The degree of similarity in step c) can be established by selecting a metric.

This metric can be selected using the software graphical interface from a list of several different metrics.

A projection algorithm can be selected when this metric is selected.

This selection can be made using the software graphical interface from a list of several different projection algorithms.

An unsupervised classification algorithm can be selected when this metric and this projection algorithm are selected.

This selection can be made using the software graphical interface from a list of several different unsupervised classification algorithms.

The data processing method may also include steps consisting in:
  receiving new data,
  detecting, using a calendar model, from the time metadata associated with this new data, whether this new data qualifies for a particular group from among the said groups,
  checking whether this new data qualifies for the particular group, using a characteristic individual model associated with the particular group,
  use of a regression model to obtain a nominal energy consumption value,
  comparing the nominal consumption value with the new data with.

One embodiment of the present invention provides for a computer program including program code instructions to enable the computer processing system to perform one or more of the steps of the method as defined above.

One embodiment of the present invention also provides for a digital data medium which can be used by a computer processing system, including code instructions of a computer program as referred to above.

BRIEF DESCRIPTION OF THE DRAWINGS

The present invention will be better understood on reading the description of example embodiments given purely as an indication and in no sense restrictively, making reference to the appended drawings in which:

FIGS. 4A-4H illustrate an indicator panel of an example graphical interface of the data analysis and modelling tool;

Identical, similar or equivalent parts of the various figures described below have the same numerical references, to make it easier to move from one figure to another.

The various portions represented in the figures are not necessarily represented at a uniform scale, in order to make the figures more readable.

The various possibilities (variants and embodiments) must be understood not to be mutually exclusive, and able to be combined with one another.

DETAILED DESCRIPTION OF PARTICULAR EMBODIMENTS

Figure 1:
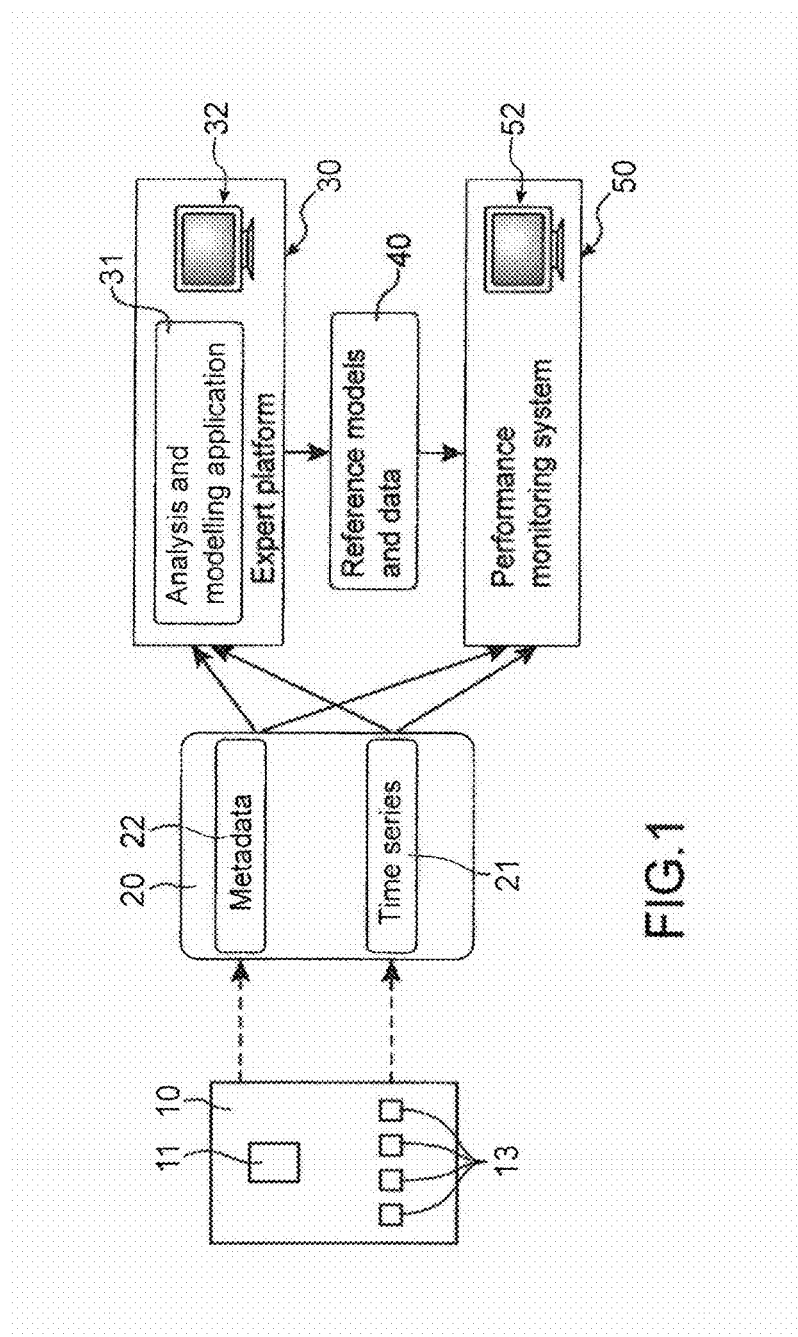
FIG. 1 represents diagrammatically a computer system including an expert platform having a tool for analysing and modelling data forming an embodiment of the present invention which allows the energy consumption of sites to be analysed using data from measurements made in these sites.

An example of a system for data processing for analysis of the energetic performance of a site, over a determined time range, is illustrated in FIG. 1.

The site analysed may be, for example, a building or a factory or a commercial premises, or a data centre where it is desired to undertake an energy consumption audit. This site is equipped with at least one measuring device 10 producing data for processing.

Measuring device 10 may have one or more measuring element(s), and in particular at least one electrical consumption meter 11 and one or more measuring sensors 13, in particular sensors measuring physical magnitudes such as, for example, temperature, rate of humidity, differential pressure, or air speed. Measuring device 10 may provide a large quantity of data for analysis. Certain sensors can, indeed, provide data at a frequency of the order of at least one measurement per minute.

Data 21 for processing taken from measuring device 10 includes data time series 21. These time series can be sequences of time-value measurement pairs.

The time series are accompanied by metadata 22, i.e. data which explains the time series. Within this metadata 22, metadata of a first type can be distinguished which is called "series", which contains first descriptors of the time series.

An example of series metadata: [Building=Site_38TEC, Zone=Office, Type=Energy, Sensor=PM200] indicates a particular zone of the building which is analysed, and also the type of measurement data analysed, and the type of sensor from which this measurement data is taken. metadata of the second type, called "time metadata" also accompany the data time series. The time metadata are descriptors of a point in time. For example, a date "18/02/14 00:00" can be described with the following time metadata: [year=2014, month=February, day=18, day of the week=Tuesday, quarter=1, six-months=1].

The measurement data is analysed using an application 31, which is an example of the present invention, more specifically using an analysis and modelling application which can be installed on a computer platform 30, called an "expert platform". Expert platform 30 can be centralised or, as a variant, distributed over several computer installations.

Application 31 can, if applicable, be accessible by means of a computer system of the "cloud computing" type. Analysis and modelling application 31 includes, in particular, a visual analysis tool allowing visual and interactive exploration, and also a graphical representation of imported measurement data.

Analysis and modelling application 31 allows searching for groups of data having similar time profiles, even with a substantial volume of data.

Analysis and modelling application 31 can be controlled by a user and/or at least one computer script. In both cases the data processing undertaken by application 31 allows one or more digital models of the energetic performance of the site analysed within a determined time range to be established.

The models produced by analysis application 31 can be integrated in computer files which can be used by office suite applications.

These files can, for example, be in a first form called a "report", or a second form called a "project", and facilitate understanding and profiling of the energetic performance of the site, and also facilitate comparative analyses.

An example of a digital model gives the electrical consumption as a function of the average temperature in the site for a given period, for example on a daily basis. Graphical representations of such models can be displayed using a graphical interface of application 31.

Figure 6:
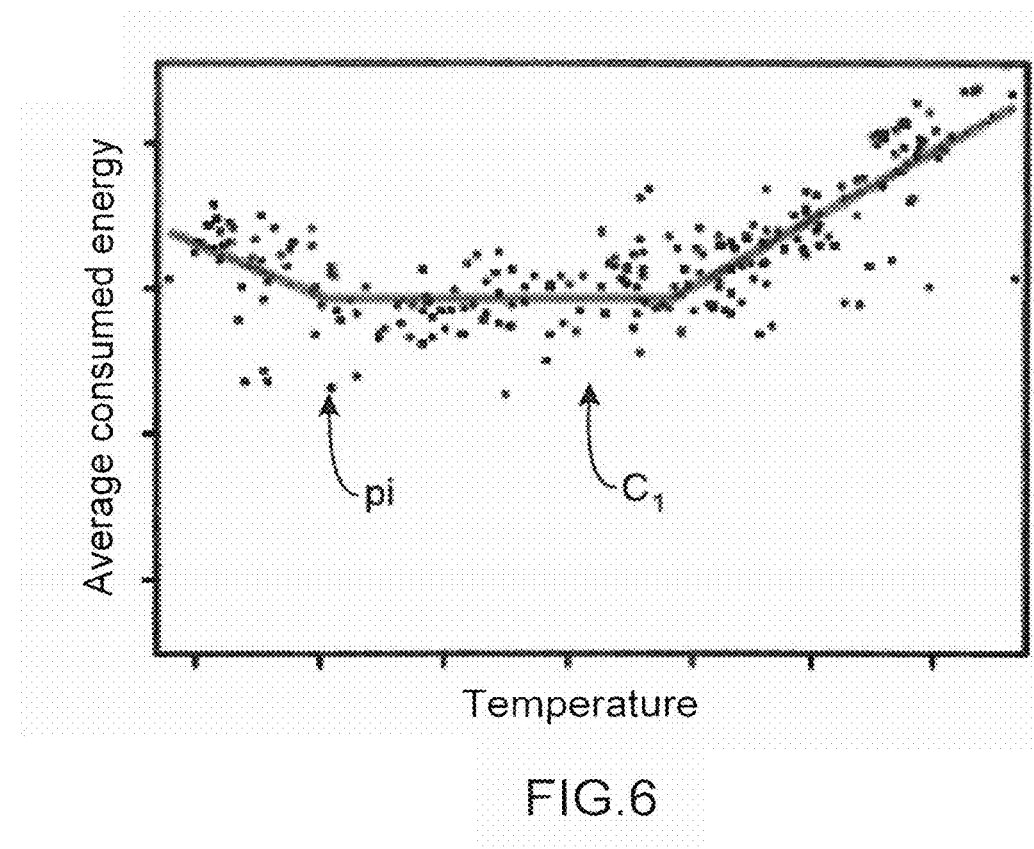
FIG. 6 represents a standard profile of electrical energy consumed as a function of temperature which may be obtained, displayed using the data analysis and modelling tool.

As an example, FIG. 6 gives a graphical representation $C_1$, obtained using application 31, of the model of the average energy consumed by a site as a function of temperature. Application 31 allows improved discrimination of measuring points Pi by enabling groups to be created and named, and allows aberrant measuring points to be isolated more easily: in this case only the "non-aberrant working days" group has been retained, which has enabled an efficient digital model to be constructed.

Thus, in addition to the use of digital models, application 31 allows a user to make a visual analysis of the measurement data using the graphical interface.

Application 31 also enables groups of data relating to similar situations to be extracted and/or identified, and then, if applicable, enables these groups to be associated with an identifier generated using a naming algorithm, and a digital model of the group's performance to be produced.

For example, if the site under analysis is a commercial premises, a group of measurement data produced on non-working days and on public holidays can be created and analysed in order to compare it with another group of measurement data made on working days.

Application 31 can also include an analysis tool, a query tool enabling searches to be performed on the data, and enabling the data to be extracted, sorted and formatted.

Application 31 can also include user interface libraries, graphical libraries, libraries for managing and transforming in-memory data, libraries for generating data from models, a tool for storing and managing data, a tool for storing and managing models, and a tool for storing and managing projects.

Models 40 and data produced by expert platform 30 can then be used by a computer system 50 for site performance monitoring. Such a system 50 can also receive data from measuring device 10. Performance-monitoring system 50 can be configured to make a comparison between a model or a set of reference models provided by application 31 of expert platform 30, and the actual performance of the site given in real time, continuously, by means of data from measuring device 10. This performance-monitoring system 50 can be centralised or, as a variant, distributed over several computer installations 52, in which applications developed by the applicant, such as "Energy Operation First" or "Facility Insight", "StruxureWare Plant Operation Ampla", "StruxureWare Resource Advisor", or "Remote Energy Management", can also be deployed, and enable, by using models produced by platform 30, a prediction to be made, for example a prediction of an imminent peak in consumption and of its cost, or can enable a malfunction to be detected, for example abnormal electrical excess consumption, or can let a comparison be made with other sites in order to define tools for improving the energy performance of the analysed site.

Figure 2:
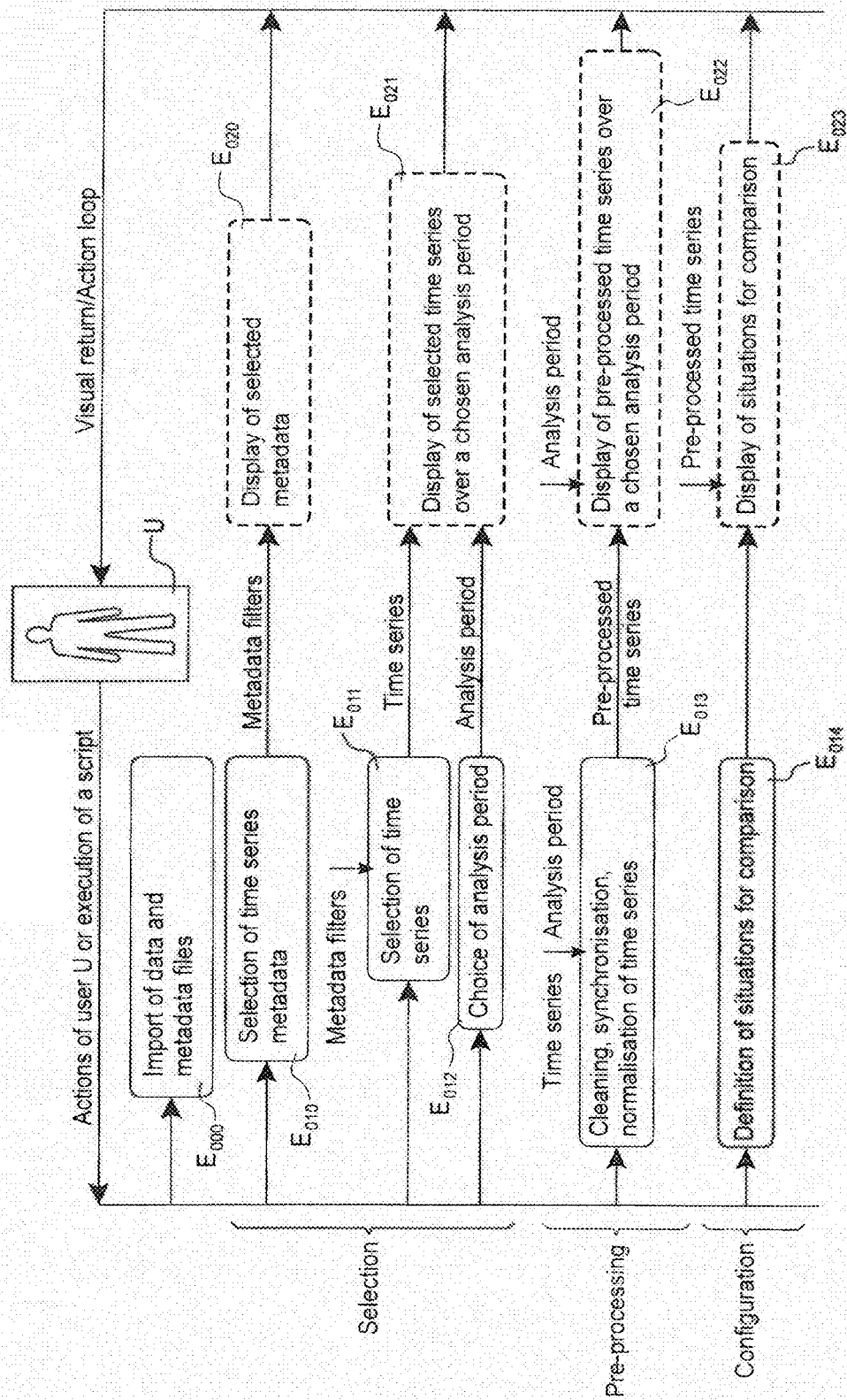
FIG. 2 represents an example of a flowchart showing a first sequence of processing steps which may be implemented by the data analysis and modelling tool.
Figure 3:
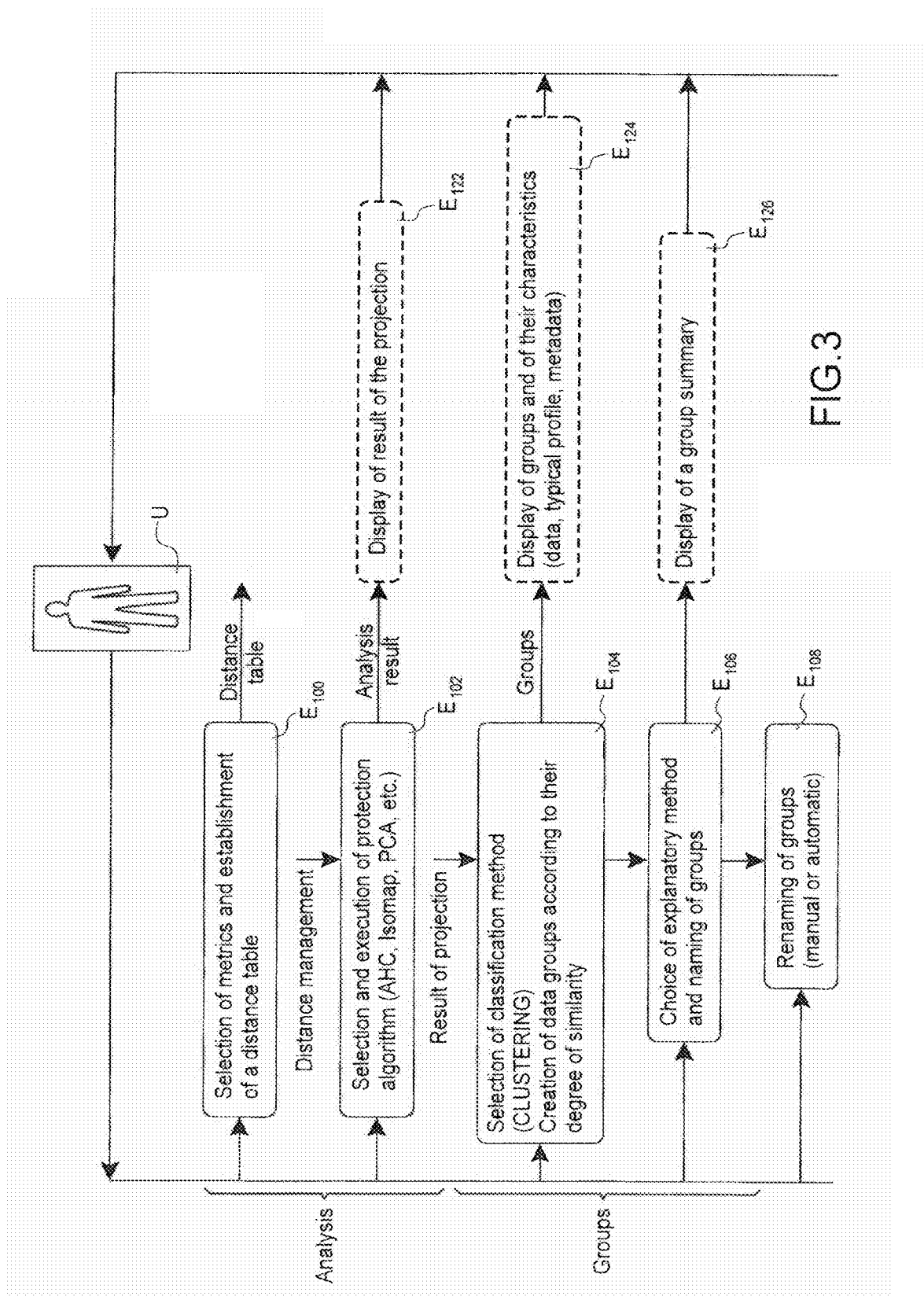
FIG. 3 represents an example of a flowchart showing a second sequence of processing steps which may be implemented by the data analysis and modelling tool.

FIGS. 2 and 3 illustrate data processing phases including steps also called "actions", which can be implemented by analysis and modelling application 31. In these figures, each action (represented by a box with a solid outline) to configure or execute an algorithm produces a result (represented by an arrow pointing away from the solid-outline box), which can be used to create or update one or more displayed interactive graphical views (the display action being represented by a box with dotted outline) on a screen, in particular a computer device of platform 30.

Use of certain actions, the creation or updating of interactive graphical views, can, in certain cases, be conditional on prior receipt of processing results (represented by arrows placed above the boxes), or on input by the user.

If a human user is controlling application 31 the interactive graphical views help this user with their analysis of the data from the site, and let them choose a subsequent action, or produce a diagnosis of the site's energy consumption.

Prior to a data processing phase enabling models to be established, a phase called the "preparatory" phase illustrated in the sequential flowchart of FIG. 2 is implemented by application 31.

During this preparatory phase, selection actions, preprocessing actions and configuration actions under the control of user U or of a computer script are executed.

The time series and their metadata can be imported (step $E_{000}$ in FIG. 2) to expert platform 30 before this preparatory phase.

The imported data and metadata can originate, for example:
 from one or more remotely managed computer installations, such as those of the SCADA-type (Supervisory Control and Data Acquisition) and/or,
 from a continuous control platform connected to measuring device 10 of the site under analysis and/or,
 from a dedicated data and metadata collection system.

The import step is optional when the data and metadata requiring processing are in the form of one or more files which have been pre-recorded in platform 30.

The data series to be analysed are then selected. This selection can be made directly (step $E_{011}$) or by selecting particular metadata (step $E_{010}$), and can then be displayed (steps $E_{020}$ and $E_{021}$).

This selection is also accompanied by a selection of an analysis time range (step $E_{012}$) on which it is desired to concentrate the analysis. This time range can be continuous, for example over one year or over one six-months, or over one month or one week. As variant, this time range can be discontinuous. For example, all the working days of a year can be selected, or all working hours of a day. Another example of a selection of a discontinuous range contains site data taken from Monday to Thursday for all the weeks of a year.

In addition, the details of the rates of missing data over a given time range selected, for example over a day, can be determined by application 31 and displayed. This can assist the user to make their choice of the analysis time range.

After this selection a step of pre-processing (step $E_{012}$) is performed. This pre-processing can include a sub-step of cleaning, particularly in order to eliminate aberrant data. For example, measurement data outside a working range in which the sensors of measurement device 10 are supposed to operate can be eliminated in such a step.

The pre-processing can also include synchronisation or re-synchronisation of the time series over a fixed sampling interval chosen by the user. This synchronisation can be achieved by interpolation. The fixed sampling interval can be, for example, 1 minute, or 10 minutes, or 1 hour, or 1 day. This step can be useful in particular when the sampling of the measurement data is irregular.

The pre-processing can also include a sub-step of normalisation of the time series, during which, in particular, the scale can be changed. The result of the pre-processing step can then be displayed (step $E_{022}$).

The preparatory phase also includes an additional step (step $E_{014}$) in which the time metadata is selected, the selected time series then being segmented into segments of identical duration. For example, the data time series may be segmented into segments of one month or one week, or preferably one day. This step of segmentation enables situations for comparison to be defined.

The segmentation can also include a selection of a particular series metadata.

For example, a site zone descriptor may be selected, in order to select only data relating to one or more specific zones of the site, from among all the zones covered by measuring device 10. By this means a comparison of the energy consumption of site zones can be made.

A descriptor of the measurement sensor type may also be selected, for example, in order to select only data from one or more specific sensors of measuring device 10. Such a selection enables a comparison to be made between the data from a first group of sensors, and data from a second group of sensors.

According to another example, a descriptor of a the measuring parameter type may also be selected, in order to select only data relative to one or more types of particular physical parameter from among all the physical parameters measured by measuring device 10.

After the preparatory phase, a processing phase called the "analysis" phase, leading to a projection of data segments, and a processing phase called the "groups" phase, enabling groups of projected data segments having similarities to be formed, is then performed.

In FIG. 3 an example of a flowchart of steps performed in such an analysis phase is given.

In order to be able to measure the similarity between data segments, a table of distances is first established (Step $E_{100}$ in the sequential flowchart of FIG. 3).

To do so, prior to this step, a metric can be selected from a list of pre-recorded metrics. A metric is a function which defines the distance between the elements of a set. The selected metric can be, for example, of the Euclidean distance type or, for example, of the DTW type (for Dynamic Time Warping) or of the CID type (for Complexity Invariance Distance) or of the Manhattan distance type, or alternatively of the DcorT type, and as described, for example, in the document of Ahlmane Douzal-Choukria and Cecile Amblard: "Classification trees for time series", Pattern Recognition journal, vol. 2, no 45, p. 1076-1091, 2011.

A metric configured or imported by user U themselves can also be selected and used. Application 31 can thus also include a tool allowing user U to define by themselves a metric different from those which are pre-recorded.

When the distance table has been established by application 31 a projection algorithm is executed (Step $E_{102}$) in order to project the time series segments in a space of at least two dimensions, according to their degree of similarity. The projection algorithm can also be selected beforehand by user U from among multiple projection algorithms. The projection algorithm can be, for example, an algorithm of the ISOMAP type or of the hierarchical clustering type, or of the principal component analysis type (also designated by the acronym PCA).

The result of this projection can then be displayed (step $E_{122}$) using the software graphical interface of application 31.

The selection of the metric, the import of the metric, and the selection of the projection algorithm, can be made by user U, for example using scrolling menus in a command window of the graphical interface. This command window may be the same window as the one from which a data import and an analysis range selection can be made.

A step of classification of the data (step $E_{104}$), also called "clustering" is made. This step can include a selection of a non-supervised classification algorithm, and leads by execution of this algorithm to the formation or highlighting of similar projected data groups, and to the highlighting or discrimination of aberrant data. To undertake this classification, a partitioning algorithm of the k-means type, partitioning around medoids type (PAM, k-medoids), CLARA (acronym of "Clustering LARge Application"), dynamic clouds method, fuzzy classification type (FANNY), or DBSCAN type (acronym of "Density-Based Spatial Clustering of Applications with Noise"); or an algorithm of hierarchical classification of the ascending hierarchical classification type (AGNES, acronym of "agglomerative nesting"), or of the descending classification hierarchical type (DIANA, acronym of "divisive analyzing") can be used.

This classification can be performed from the result of the projection step or, according to a variant (not represented in FIG. 3), can be coupled to the projection step.

In addition to this "automatic" classification into data groups, a "manual" classification implemented by the user can also be made, for example from a view in which the projected data is displayed.

A display (step $E_{124}$) of the groups and of their associated characteristics, for example of a typical profile, of associated metadata, can be made using different interactive views.

Examples of such interactive views are given in FIGS. 4A-4H.

An identifier can then be associated with each data group.

The groups can, for this purpose, then be named "manually" by the user, on the basis of their understanding of the group provided, for example, by the different interactive views in which these groups and their associated characteristics are represented.

Automatic naming of the groups, or assistance with manual naming, can also be provided (step $E_{105}$), using an algorithm using a decision tree executed on the metadata associated with these groups.

As variant, the data group can be associated with an identifier semi-automatically. In this case, application 31 proposes an identifier for data group established according to detected similarities.

Figure 5A:
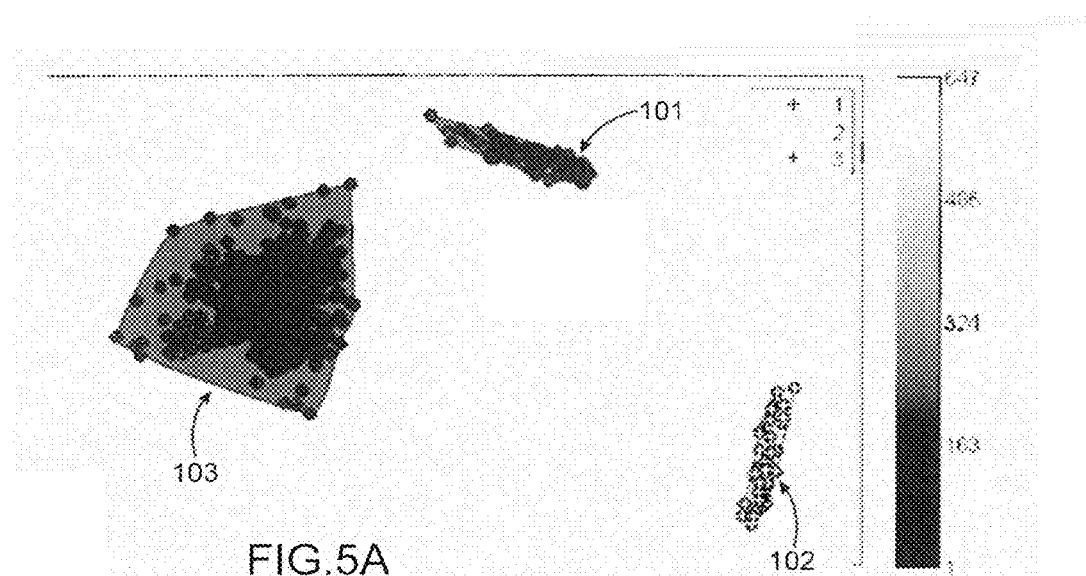
FIGS. 5A-5B illustrate groups of projected data and their association with an identifier using a decision tree by the data analysis and modelling tool.
Figure 5B:
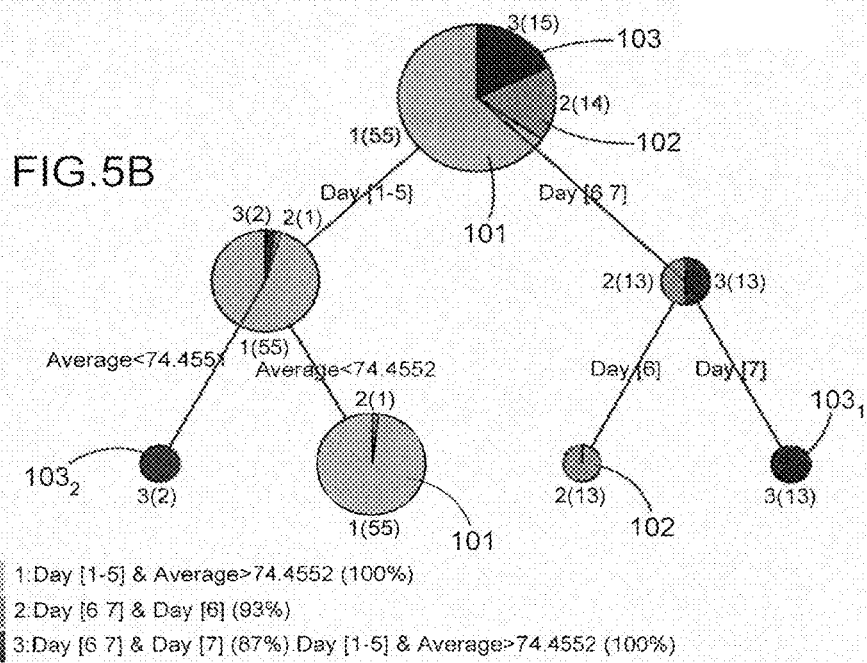

In FIG. 5B an example of a decision tree which enabled three identified data groups 101, 102, 103 to be named is given.

The corresponding groups are represented in a view illustrated in FIG. 5A.

In this example the time series have been segmented into segments of duration equal to one day. The naming algorithm using the decision tree identifies a first data group 101 having similarities in relation to several criteria, since most of the data of the first group is data taken during one of the first 5 days of the week, and data over one day of measurement of a parameter on average above or equal to a given threshold.

A second group 102 of data is also identified.

In this example most of the data of the second group is data taken during the $6^{th}$ or $7^{th}$ day of the week.

A third group 103 of data is also identified. The third data group 103 includes a sub-group $103_1$ of data taken during one of the first 5 days of the week, and for measurement of a parameter below a given threshold. Third data group 103 includes another sub-group $103_2$ of data taken during the $6^{th}$ or $7^{th}$ day of the week.

The algorithm names, for example, the first data group "day [1-5] and av.>=75".

In addition to providing the possibility of assisted naming of groups of projected data, the naming algorithm and its associated decision tree thus enable criteria of qualification for a data group to be highlighted for the user.

The user can then, as applicable, rename a group according to their understanding of it.

A step (step $E_{126}$) of display of a graphical summary summarising the characteristics of all or of a subset of data groups can then be made.

Figures 4A, 4B:
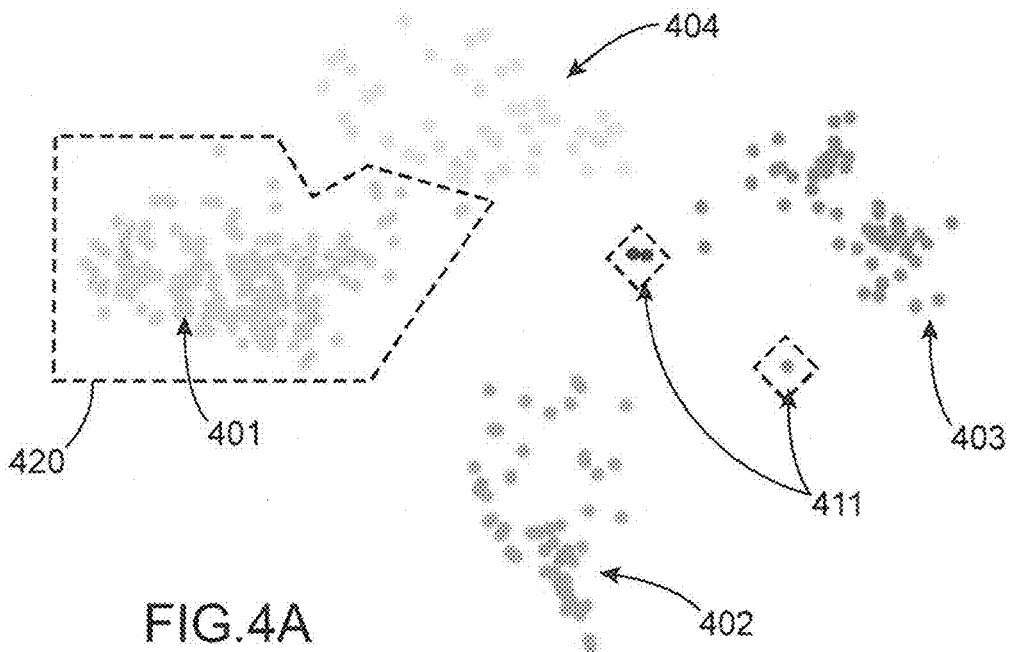

The view in which the projections of data segments are represented can be an indicator panel window as illustrated in FIG. 4A.

In this window, four clusters corresponding to four groups 401, 402, 403, 404, of projected data segments distinguished by different colours (in FIG. 4A the colours are replaced by grey levels) are represented.

The user can select segment(s) or a group or a sub-group using a graphical selection tool 420 shown, for example, in the form of a selection polygon or lasso.

Selecting segments in the window of FIG. 4A can lead these same segment(s) to be selected in other windows of the indicator panel, and vice versa. User U can thus navigate through the mass of data using multiple windows giving views in addition to that of the projection illustrated in FIG. 4A. Individual segments 411 located at a given distance from the clusters can constitute aberrant values to be eliminated, which user U can select and then, as applicable, delete.

As mentioned above, the respective segments of data groups 401, 402, 403 and 404 can be associated with an identifier.

In another window of the indicator panel given in FIG. 4B, the data segments qualifying for first group 401 are identified as "working days". The segments of first group 401 can, for example, be days during which the site is operational, meaning that its electrical consumption is higher than a given threshold and is roughly constant over a given time interval of the day.

The segments qualifying for a second group 402 are identified as "closed days". The segments of the second group can be days during which the site is not operational, meaning that electrical consumption lower than a given threshold is generated, which is roughly constant over the above-mentioned time interval.

The segments qualifying for a third group 403 are identified, for example, as "start-up days", and are days during which the site is operational only for part of the day.

The segments qualifying for a fourth group 404 are identified, for example, as "closure days", and are days during which the site is operational only for part of the day.

Another window of the indicator panel illustrated in FIG. 4C gives an energy consumption level of the site, in particular its electrical consumption, over a period which is the same period as the one for which the data time series were previously segmented.

In the example of FIG. 4C, curves 411, 412, 413 and 414 are representative of standard electrical consumption profiles during a day, respectively for data from first group 401, for data from second group 402, for data from third group 403, and for data from fourth group 404.

Figure 4D:
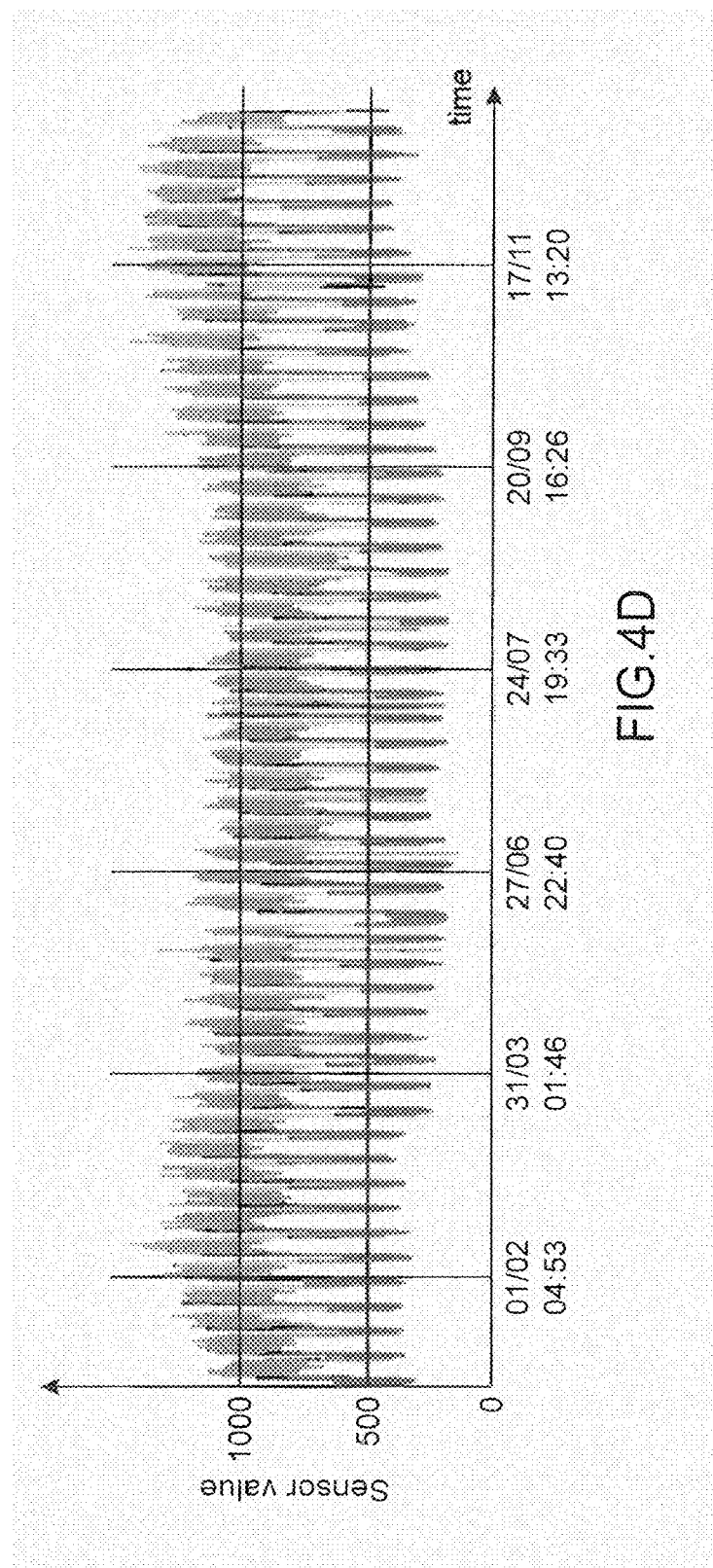

In another indicator panel window given in FIG. 4D, measurement data taken from sensors of measuring device 10 is represented for an analysis time range selected, for example, using the window of FIG. 4H listing the dates on which the measurements were made.

Figure 4E:
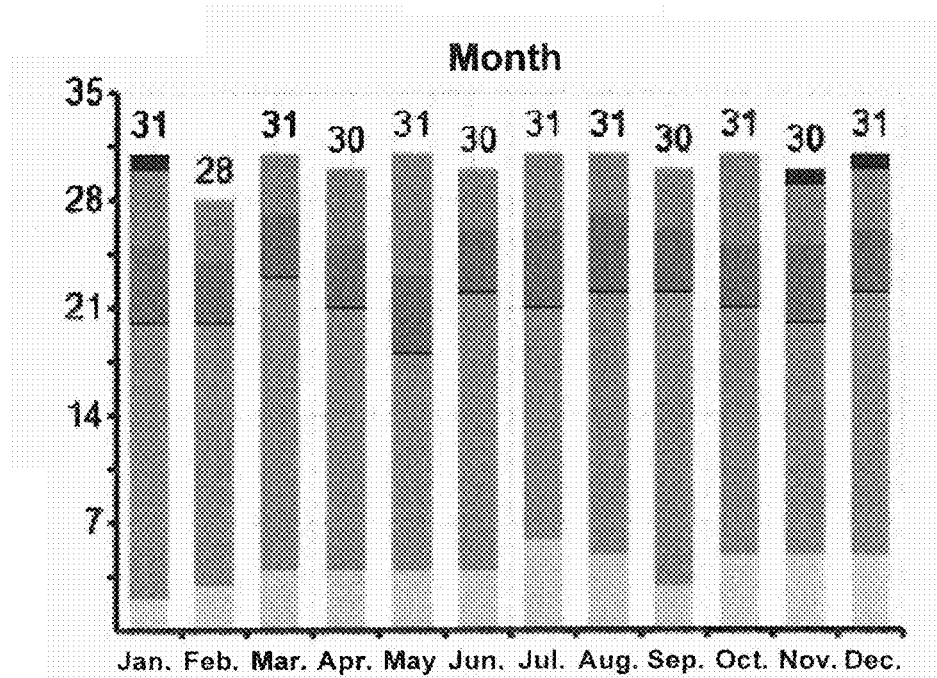
Figure 4F:
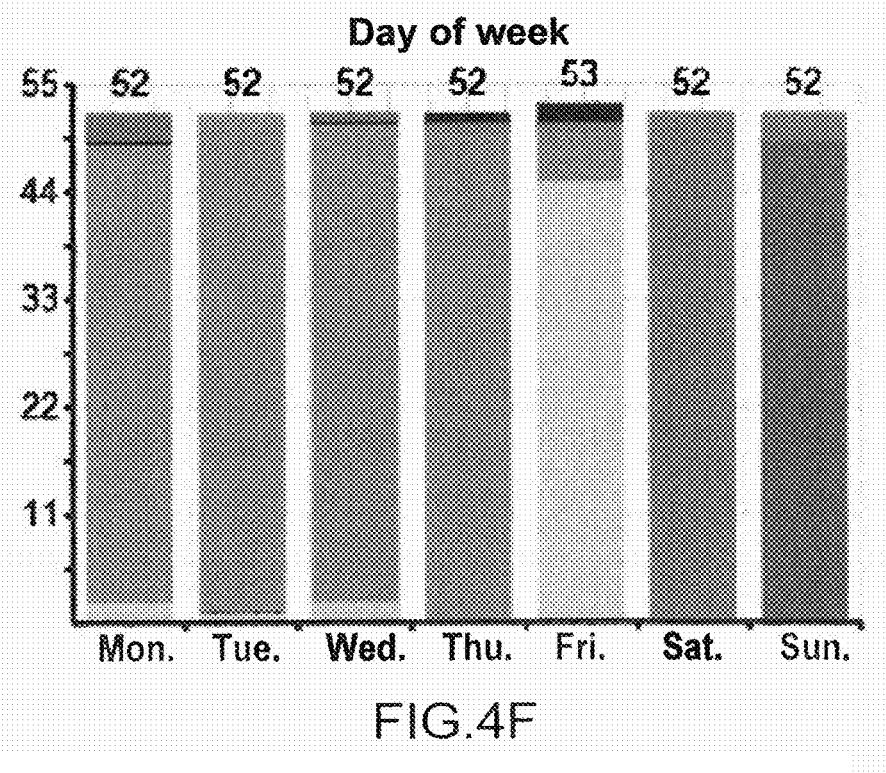
Figure 4G:
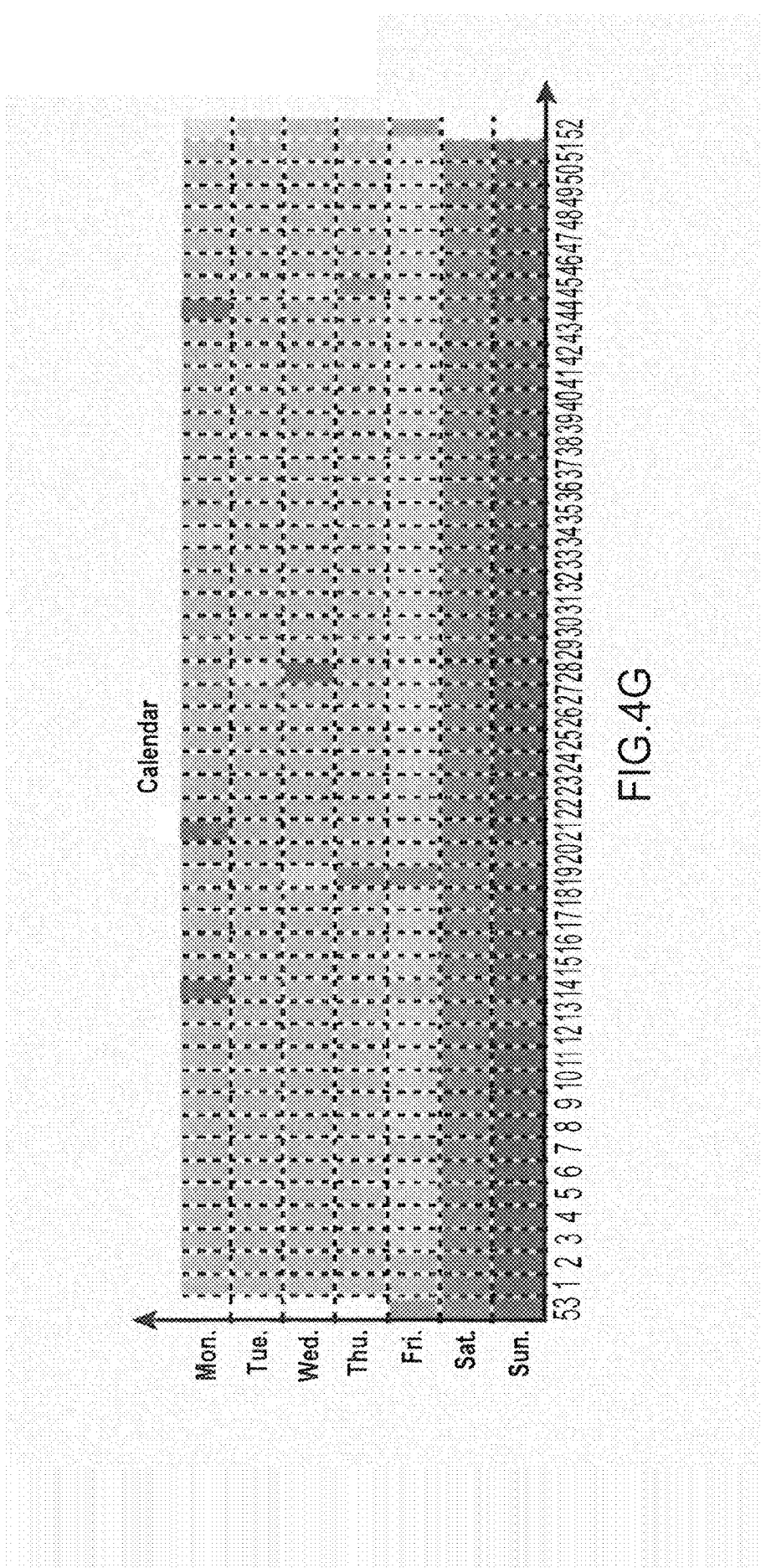

The indicator panel can include other windows, as illustrated for example in FIGS. 4E, 4F and 4G, giving additional views, in the form, respectively, of a monthly bar chart, a bar chart for days of the week, and a calendar, in which the projected data is represented in a manner which can be identified by the user, and which allows a correspondence to be made with groups 401, 402, 403 and 404 of the window of FIG. 4A.

In the example of FIGS. 4E-4G this correspondence can be established by the user using different colours (here, grey levels), re-using those used in the window of FIG. 4A.

The windows of FIGS. 4F and 4G give the user information in addition to that of the windows of FIGS. 4A and 4B. For example, they show that the data of second group 402, identified as "closed days", is for the most part data taken on the site on Saturdays.

A graphical summary with one or more windows described above for one or more groups can be included in a report.

A backup can also be made, in the form of files of the project type.

The results of the processing described above can be exported in the form of spreadsheets, for example in Excel file spreadsheets, which tool 31 is configured to generate.

The graphical interface of the application tool can be used such that, in addition to the first window of FIG. 4A, other windows, from among the ones described above, allow data segment groups to be created or edited.

Recursive selection tools can also allow, in the indicator panel described above, a selected group of segments to be passed to a sub-group of this selected group.

After data segment groups have been established, a phase of establishment of digital models characterising each segment group can then be implemented.

The characteristic individual model of a particular group can be constructed using a learning algorithm, in which it is checked whether each new data segment qualifies for this particular group, or whether this segment is different from everything seen previously.

To do so, in particular, a time profile analysis of changes of measurement signals taken from the measuring device, which are contained in this new segment, may be made.

An example of a time profile gives an electrical consumption for the duration of a segment, for example a daily electrical consumption when segments of duration equal to one day are made.

The learning algorithm of the characteristic individual model can be, for example, of the kernel principal components analysis type (also called "KernelPCA"). An algorithm of the one-class Support Vector Machine, or one-class SVM, type can also be used. This type of algorithm includes a process of learning a decision function in order to detect novelty. The learning algorithm can also be of the SMO type (Sequential Minimal Optimization).

User U can select an algorithm for learning the characteristic individual model using a command window of the graphical interface. After it has been established, a group's characteristic individual model can be saved.

In addition to a group's characteristic individual model, a regression model can be implemented.

The regression model is able to provide a prediction for data of an element of measuring device 10, for example one or more sensor(s) or one or more meter(s), on the basis of data taken from one or more other elements (sensor(s) or meter(s)).

To establish this regression model the user can choose a second type of learning algorithm from among several learning algorithms. An algorithm of the Rigid Regression type on a polynomial model, or of the Lasso Regression type on a polynomial model, or of the RVM (Relevance Vector Machine) type can be used. User U can also select an algorithm for learning the regression model using a command window of the graphical interface.

Tool 31 can also be configured to form, for a projected data group, another type of individual digital model called a calendar individual model. This model can use the assisted naming decision tree mentioned above to enable it to be determined for which data segment group a particular segment qualifies, receiving a time indication associated with this particular data segment. A calendar individual digital model gives a condition of qualification of new data for the first group using time metadata associated with the said new data.

By this means, using such a calendar model, a group called "closed days" can be modelled, for example, by segments corresponding to "all Sundays AND all French public holidays, EXCEPT FOR Easter".

A site performance monitoring computer system 50, as mentioned above in connection with FIG. 1, collects regularly, for example each day, data from measuring device 10, and then presents it to the user in the form, for example, of indicator panels, alarm panels, monitoring indicators, and in particular key performance indicators (KPI).

Such a performance-monitoring system 50 can use one or more models described above to enable, for example, possible energy gains made on the site under analysis to be assessed, or to detect a possible deterioration of a site's energy consumption.

Figure 7:
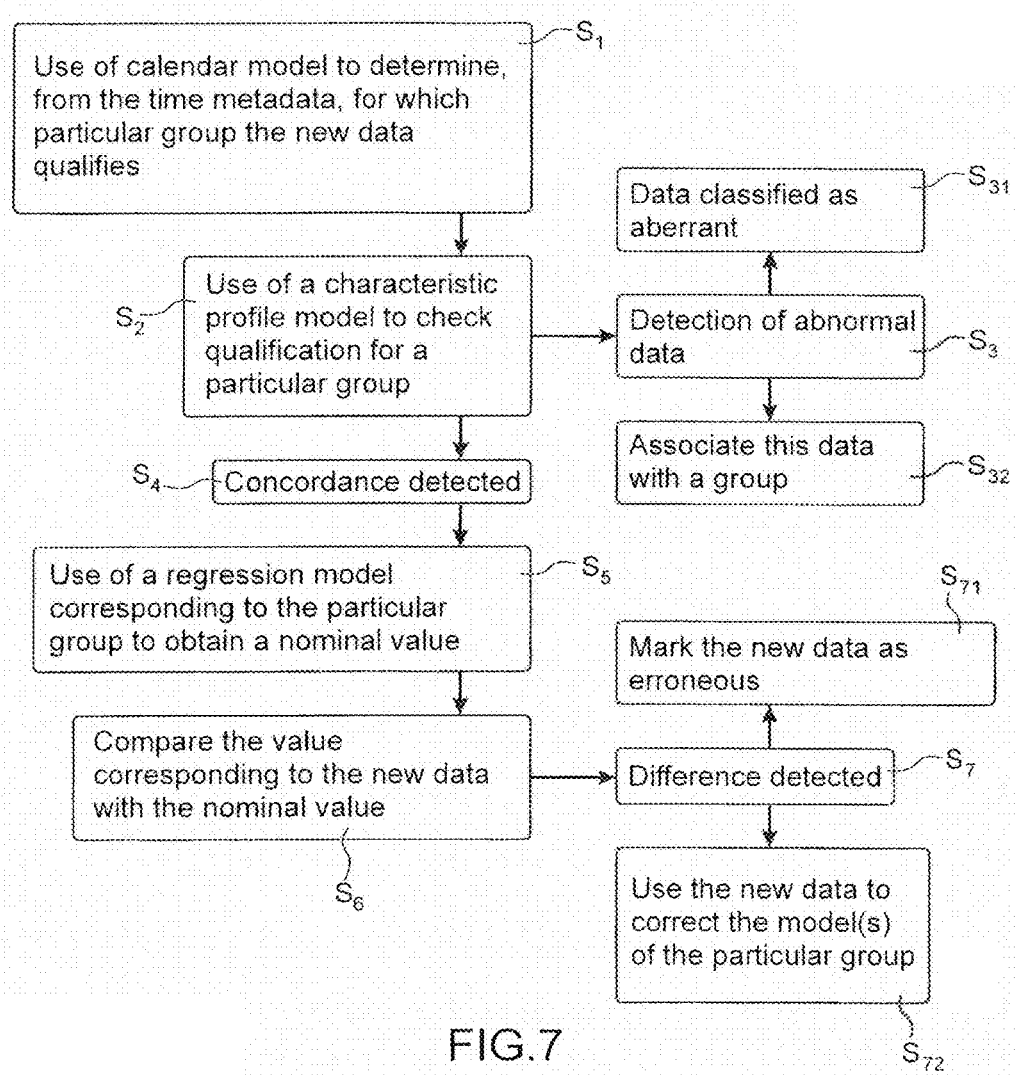
FIG. 7 represents an example of processing by a performance-monitoring system configured using one or more reference models provided by the data analysis and modelling tool according to the invention.

An example of processing performed by monitoring system 50 when it receives new data will now be described in connection with FIG. 7.

When new data is received by monitoring system 50, this system can use the calendar model to allow it to be determined, from the time metadata associated with this new data, to which particular group this new data corresponds (step S1).

System 50 also uses the characteristic profile model of this particular group to check that this new data qualifies for the particular group (step S2).

In this case, either qualification of the new data for the particular data group is detected, or the new data is classified as "abnormal" (step S3).

In this case, a user of the performance monitoring system may then decide either to classify this new abnormal data as aberrant data (step S31), or to associate it, nonetheless, with a data group (step S32).

If there is concordance (step S4) and it is detected that the new data qualifies for the particular data group both using the calendar model and the characteristic individual model, a regression model associated with this group is used, in order that energy efficiency monitoring may be undertaken (step S5).

For example, it is possible to detect by means of the calendar model that new data corresponds to a group of data segments named "working days", and to check by means of the characteristic individual model that the measurement data profile associated with or contained in this new data corresponds to a characteristic profile of measurements made during working days.

In this case, a corresponding regression model can then be used to obtain a nominal electrical consumption value (step S5), for example of E=12 kWh, of a working day, and to be able to make a comparison with this nominal value (step S6).

A significant difference from the nominal value, for example detected using a detection threshold with an absolute or relative value (step S7), can then be interpreted as an error (step S71) or used to correct the model corresponding to the working days (step S72).

Such a system can enable the effect of an improvement made to the site to be monitored, in order to reduce its energy consumption, or to monitor an unexpected deviation which deserves to be signalled.

The invention claimed is:

1. A data processing method for analysis of the energy consumption of at least one site using measurement data, including electrical consumption measurement data and also data for measuring one or more physical parameters, taken from at least one measuring device installed in this site, the method comprising:
   measuring, by sensors included in the measuring device, the physical parameters which include at least one of temperature, rate of humidity, differential pressure, and air speed, the physical parameters to generate time series data; and
   by a computer processing system:
   a) selecting, within a chosen analysis time range, the time series of data taken from the measuring device, where the time series are associated with metadata which explains the said data time series,
   b) segmenting the data time series into multiple data segments of identical duration, the multiple data segments including at least types of operational days at the at least one site, including working days, closed days, start-up days, and partial operational days,
   c) projecting the selected data segments located within this analysis time range in a space having at least two dimensions, according to their degree of similarity,
   d) displaying in a software graphical interface by means of a display device connected to the computer processing system, a graphical representation of the said space including projections of the data segments, where some projections are grouped together in the form of one or more groups of data segments, such that the data segments are visually clustered based on the type of operational day, e) selecting at least one first group of data segments based on receiving an input from a user in the software graphical interface of a drawn region surrounding a visually displayed cluster of data segments corresponding to one of the types of operational days, wherein the drawn region excludes one or more aberrant data segments corresponding to the one of the types of operational days which are not displayed within the visually displayed cluster of data segments, and deleting the one or more aberrant data segments in the software graphical interface based on receiving an input from the user of a drawn region surrounding the one or more aberrant data segments, and f) establishing one or more digital models characterising the first selected group of data segments.

2. The method according to claim 1, wherein the models established in step f) include an individual digital model characteristic of the first group constructed from an analysis of measuring time profiles contained in the data segments of one of the said groups.

3. The method according to claim 2, further including, after step e), steps comprising:
acquisition of new data,
using the characteristic individual digital model to check whether new data qualifies for a data group.

4. The method according to claim 1, wherein said models established in step e) include a calendar individual digital model giving a condition of qualification of new data for the first group on the basis of time metadata associated with the said new data.

5. The method according to claim 1, where the method further includes the establishment of a regression model able to provide an estimate of measurement data of at least one selected element of the measuring device on the basis of data from one or more other measuring elements(s) of the measuring device.

6. The method according to claim 1, further including steps comprising:
establishing for the first group a standard profile of magnitude(s) measured by the measuring device for a duration equal to that of the segments,
displaying this standard profile using the graphical interface.

7. The method according to claim 1, further including steps comprising:
associating the selected first group of data segments with an identifier.

8. The method according to claim 7, wherein the identifier is produced using a naming algorithm implementing a decision tree and using metadata associated with the data segments of the selected first group.

9. The method according to claim 1, wherein the selection of the data time series in step a) includes a selection of at least one type of metadata, in particular:
of a site zone descriptor to select time series of measurement data taken from one or more specific zones of the site from among a set of zones in the site,
and/or a descriptor of the measuring device type to select time series of data taken from one or more types of specific measuring means from a set of measuring means of the measuring device,
and/or a descriptor of the site measuring parameter type to select time series of data relating to one or more types of physical parameters from among a set of physical parameters which the measuring device is able to measure.

10. The method according to claim 1, wherein said graphical representation is in a first window of the software graphical interface, and wherein the segments are further represented in a form of another graphical representation in a second window of the graphical interface, where the selection of the first group in the said first window leads to selection and highlighting in the said second window of the segments of the first group.

11. The method according to claim 10, wherein the selection of the data time series made in step a), or the selection of the first group made in step e), is accomplished by means of this other graphical representation.

12. The method according to claim 1, wherein the degree of similarity in step b) is established using a metric, where the metric is selected by means of the software graphical interface from among a list of several different metrics.

13. The method according to claim 1, including steps comprising:
receiving new data,
detecting, using a calendar model, from the time metadata associated with this new data, whether this new data qualifies for a particular group from among the said groups,
checking whether this new data qualifies for the particular group, using a characteristic individual model associated with the particular group,
use of a regression model to obtain a nominal energy consumption value,
comparing the nominal consumption value with the new data.

14. A non-transitory computer readable medium that stores a program, which when executed by a computer, cause the computer to perform a data processing method for analysis of the energy consumption of at least one site using measurement data, including electrical consumption measurement data and also data for measuring one or more physical parameters, taken from at least one measuring device installed in this site, the method comprising:
receiving from sensors included in the measuring device, the physical parameters which include at least one of temperature, rate of humidity, differential pressure, and air speed, the physical parameters to generate time series data; and
selecting, within a chosen analysis time range, the time series of data taken from the measuring device, where the time series are associated with metadata which explains the said data time series;
segmenting the data time series into multiple data segments of identical duration, the multiple data segments including at least types of operational days at the at least one site, including working days, closed days, start-up days, and partial operational days;
projecting the selected data segments located within this analysis time range in a space having at least two dimensions, according to their degree of similarity;
displaying in a software graphical interface by means of a display device connected to the computer processing system, a graphical representation of the said space including projections of the data segments, where some projections are grouped together in the form of one or more groups of data segments, such that the data segments are visually clustered based on the type of operational day;

selecting at least one first group of data segments based on receiving an input from a user in the software graphical interface of a drawn region surrounding a visually displayed cluster of data segments corresponding to one of the types of operational days, wherein the drawn region excludes one or more aberrant data segments corresponding to the one of the types of operational days which are not displayed within the visually displayed cluster of data segments, and deleting the one or more aberrant data segments in the software graphical interface based on receiving an input from the user of a drawn region surrounding the one or more aberrant data segments; and establishing one or more digital models characterising the first selected group of data segments.

* * * * *